US007663377B2

(12) United States Patent
Kurkovskiy et al.

(10) Patent No.: US 7,663,377 B2
(45) Date of Patent: Feb. 16, 2010

(54) SYSTEM AND METHOD FOR HIGH RESOLUTION SENSING OF CAPACITANCE OR OTHER REACTIVE IMPEDANCE CHANGE IN A LARGE DYNAMIC RANGE

(75) Inventors: Igor Kurkovskiy, Twinsburg, OH (US); Daniel Royer, North Canton, OH (US); Hermann Wieth, Chagrin Falls, OH (US); James William Clingersmith, Chesterland, OH (US)

(73) Assignee: Pepperl +Fuchs, Inc., Twinsburg, OH (US)

( * ) Notice: Subject to any disclaimer, the term of this patent is extended or adjusted under 35 U.S.C. 154(b) by 304 days.

(21) Appl. No.: 11/949,462

(22) Filed: Dec. 3, 2007

(65) Prior Publication Data

US 2009/0033340 A1 Feb. 5, 2009

Related U.S. Application Data

(60) Provisional application No. 60/953,866, filed on Aug. 3, 2007.

(51) Int. Cl.
*G01R 27/28* (2006.01)
*G01R 27/26* (2006.01)
(52) U.S. Cl. .................. 324/649; 324/656; 324/679
(58) Field of Classification Search ............. 324/649, 324/656, 676–679
See application file for complete search history.

(56) References Cited

U.S. PATENT DOCUMENTS

| 3,718,856 | A | * | 2/1973 | Hendriks | 324/658 |
|---|---|---|---|---|---|
| 5,144,517 | A | | 9/1992 | Wieth | |
| 5,233,231 | A | | 8/1993 | Wieth | |
| 5,933,039 | A | * | 8/1999 | Hui et al. | 327/262 |
| 6,175,605 | B1 | * | 1/2001 | Chi | 375/371 |
| 6,215,365 | B1 | | 4/2001 | Kurkovskiy | |
| 6,590,401 | B1 | | 7/2003 | Hildebrandt | |
| 6,853,931 | B2 | | 2/2005 | Kuka et al. | |
| 7,061,738 | B2 | | 6/2006 | Fey et al. | |
| 7,091,631 | B2 | | 8/2006 | Junker | |
| D534,818 | S | | 1/2007 | Schoen et al. | |

(Continued)

FOREIGN PATENT DOCUMENTS

DE    103 07 007 B3    7/2004

(Continued)

OTHER PUBLICATIONS

European Search Report, Application No./Patent No. 08104954.6-1524, Pepperl & Fuchs, Inc., Dec. 15, 2008.

(Continued)

*Primary Examiner*—Timothy J Dole
(74) *Attorney, Agent, or Firm*—Fay Sharpe LLP

(57) ABSTRACT

Systems and methods are provided for sensing or measuring capacitive or inductive reactance or changes in reactance in which the sensed reactance is coupled with a known resistance in a sensor circuit and a start signal is provided to the sensor circuit, and a programmable delay line is used to generate a programmable delay signal. The outputs of the programmable delay and the sensor circuits are compared to ascertain which transitions first, and the programmable delay value is adjusted in successive approximation fashion to identify a programmable delay that best represents the delay time of the sensor circuit from which the sensed reactance value can be determined.

20 Claims, 4 Drawing Sheets

U.S. PATENT DOCUMENTS

| | | | |
|---|---|---|---|
| 7,210,961 | B2 | 5/2007 | Berg |
| 7,236,113 | B1 | 6/2007 | Wang |
| 7,245,121 | B2 | 7/2007 | Freund et al. |
| 7,487,481 | B2 * | 2/2009 | Feng .......................... 716/6 |
| 2004/0246007 | A1 | 12/2004 | Fallot-Burghardt |

FOREIGN PATENT DOCUMENTS

| | | |
|---|---|---|
| DE | 10 2006 020 301 A1 | 11/2006 |
| WO | WO 2006/002301 A1 | 1/2006 |

OTHER PUBLICATIONS

Loris Vendrame, Luca Bortesi, Mauro Biasio, and Gaudenzio Meneghesso, "Time Domain Approach for the Evaluation of RC Delays effects in ULSI Interconnect Lines", 2005 IEEE.

* cited by examiner

SYSTEM AND METHOD FOR HIGH RESOLUTION SENSING OF CAPACITANCE OR OTHER REACTIVE IMPEDANCE CHANGE IN A LARGE DYNAMIC RANGE

REFERENCE TO RELATED APPLICATION

This application claims priority to and the benefit of U.S. Provisional Patent Application Ser. No. 60/953,866, which was filed Aug. 3, 2007, entitled SYSTEM AND METHOD FOR HIGH RESOLUTION SENSING OF CAPACITANCE OR OTHER REACTIVE IMPEDANCE CHANGE IN A LARGE DYNAMIC RANGE, the entirety of which is hereby incorporated by reference.

FIELD OF THE INVENTION

The present invention relates generally to sensing capacitance changes or inductance changes, and more particularly to systems and methods for high resolution sensing of changes in reactance in a large dynamic range.

BACKGROUND OF THE INVENTION

In many sensing applications it is desirable to ascertain the capacitance or capacitance change in a capacitor formed by two conductive plates in which a dielectric material is moved in the spacing between the plates. In one example, a capacitor is formed by two spaced plates with paper or other dielectric being moved along a path between the plates, where detecting changes in the capacitor value can indicate the presence or absence of a sheet of paper between the plates. One example includes a first plate that forms an external surface which is connected to a device ground and the other plate is an active element that is either an integral part of the device or is permanently connected to the device by wire or cable. The two plates are separated by a fixed distance, and material is passed between the plates. Of interest are minute changes in sensor capacitance due to insertion of material rather than the absolute overall value of the capacitance with no intervening material. Other sensing situations occur in which it is desired to detect changes in an inductance of a structure or fluid. Previously, sensing systems for detecting capacitance or inductance changes employed various analog components or subsystems, or banks of switched capacitors to comparing voltages or generating pulses of certain duration when the sensed capacitor or inductor is energized. However, conventional reactance sensing systems suffered from limited dynamic range and/or from limited resolution.

SUMMARY OF INVENTION

Various aspects of the present invention are now summarized to facilitate a basic understanding of the invention, wherein this summary is not an extensive overview of the invention, and is intended neither to identify certain elements of the invention, nor to delineate the scope thereof. Instead, the primary purpose of this summary is to present some concepts of the invention in a simplified form prior to the more detailed description that is presented hereinafter. The invention relates to sensing methods and systems for high resolution sensing of changes in capacitive or inductive reactance over a large dynamic range, and provides an input signal to an RC or RL sensing circuit, and also enabling a programmable delay line. The transition of the sensing circuit output past a threshold is compared with a transition in the output of the programmable delay line to ascertain whether the programmable delay time is longer or shorter than the rise/decay time of the sensing circuit. The value of the programmable delay is changed and the process is repeated to determine the programmable delay value that best approximates the charge/discharge time of the RC or RL sensing circuit using a known resistance value R.

A system is provided which includes a RC or RL analog sensing circuit that includes the capacitor or inductor to be sensed, as well as a programmable delay line (PDL), a comparison circuit, and a digital logic circuit or processor, such as a microcontroller in one example. The system compares a propagation delay generated by a sensor capacitor-based RC or inductor based RL sensing circuit to a time delay produced by the PDL under digital control. The digitally generated delay is adjusted in certain embodiments by successive approximation until it matches or closely approximates the sensor-generated delay. Overall function is controlled by the digital circuitry that initiates each measurement cycle by delivering a voltage step transition to the sensor RC or RL network. The sensor circuitry produces a transition which is delayed by an amount determined by the value of the sensed reactance. A digitally delayed voltage transition is used to test if the sensor circuit's delayed transition has yet occurred. Based upon the result of this test, the digital circuitry determines whether to increase or decrease the digitally controlled PDL delay and by how much. If the sensor circuit output transition has not yet occurred, the digital delay is adjusted longer; if it has occurred, the digital delay is reduced. In one embodiment, after each measurement cycle, the magnitude of the digital delay change is halved. Once the delay has been adjusted by the finest resolution allowable by the PDL, the final delay measurement is presented in binary form by the digital circuitry, which is representative of the sensed capacitor or inductor value. The digital circuitry involved in the device may be embodied within a microcontroller unit (MCU).

BRIEF DESCRIPTION OF THE DRAWINGS

The following description and drawings set forth certain illustrative implementations of the invention in detail, which are indicative of several exemplary ways in which the various principles of the invention may be carried out. The illustrated examples, however, are not exhaustive of the many possible embodiments of the invention. Other objects, advantages and novel features of the invention will be set forth in the following detailed description of the invention when considered in conjunction with the drawings, in which.

DETAILED DESCRIPTION OF THE INVENTION

Figure 1A:
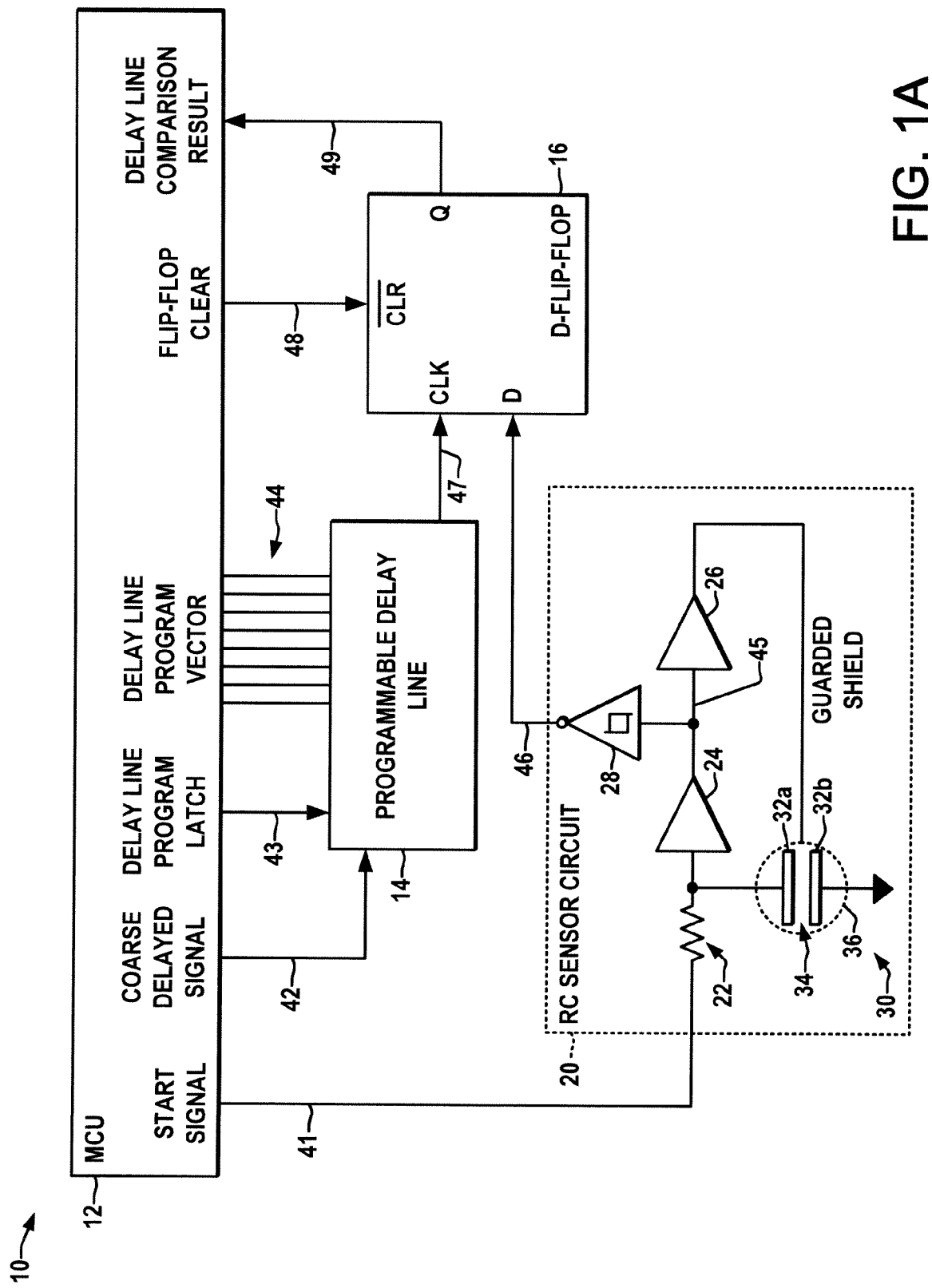
FIG. 1A is a schematic diagram illustrating an exemplary system for measuring capacitance changes of a sensed capacitor in accordance with various aspects of the invention.

Referring now to the figures, several embodiments or implementations of the present invention are hereinafter described in conjunction with the drawings, wherein like reference numerals are used to refer to like elements throughout, and wherein the various features and plots are not necessarily drawn to scale. The invention relates to systems and methods for high resolution sensing of changes in reactance in a large dynamic range. Various embodiments are illustrated and described hereinafter in the context of capacitance change measurements, although the disclosed concepts can also be embodied in association with sensing circuits that include a known resistance and a sensed inductance, and may likewise be implemented in sensing of time delays in photo sensors and other applications.

FIG. 1A illustrates an exemplary sensing system 10 including a microcontroller unit (MCU) 12, which may alternatively be any suitable form of digital logic, programmable device, hardware, software, firmware, or combinations thereof, along with a programmable delay line 14, a comparison circuit such as a D-flip flop 16, and an RC sensing circuit 20. In this embodiment, an RC charging circuit is provided by the sensor circuit 20, formed by a sensed capacitor 30 that includes an active upper conductive plate 32a and a bottom conductive plate 32b that is connected to ground, where the upper plate 32a is connected to a known resistor 22 driven by a start signal 41 from the MCU 12. The RC coupling node provides an input to a low capacitance buffer amplifier 24 providing an output to a Schmidt trigger or other type of voltage threshold detector 28 and to another buffer 26, where the output of the second buffer 26 controls the voltage of a guarded shield 36. The threshold detector output provides a signal 46 that transitions when the sensed capacitor voltage reaches a threshold, where the rise time of the RC circuit is represented by the time between actuation of the start signal 41 and transition in the threshold detector output signal 46 and the rise time is dependent upon the sensed capacitance.

The MCU 12 also provides a coarse delayed signal 42 to enable or start the programmable delay line 14, such that the time between the start signal 41 and the delayed PDL enable signal 42 can be controlled by the MCU 12, such as a predefined number of clock cycles. The MCU provides a binary delay line program vector value 44 on a j-bit bus to the PDL 14, which is an 8-bit device in one embodiment, which is latched by the PDL according to a PDL latch signal 43 from the MCU 12. The PDL 14 provides an output signal 47 which transitions from low to high the programmed delay time after the enable signal 42. This signal 47 is coupled to the clock input CLK of the flip-flop 16, and the D input is driven by the threshold detector output signal 46 from the sensor circuit 20 such that the flip-flop Q output provides a signal 49 to the MCU 12 that represents whether the PDL output signal 47 transition occurs before or after the threshold detector output signal 46 transition happens. The flip-flop 16 also includes a clear input CLR' driven by a clear signal 48 from the MCU 12.

Figure 1B:
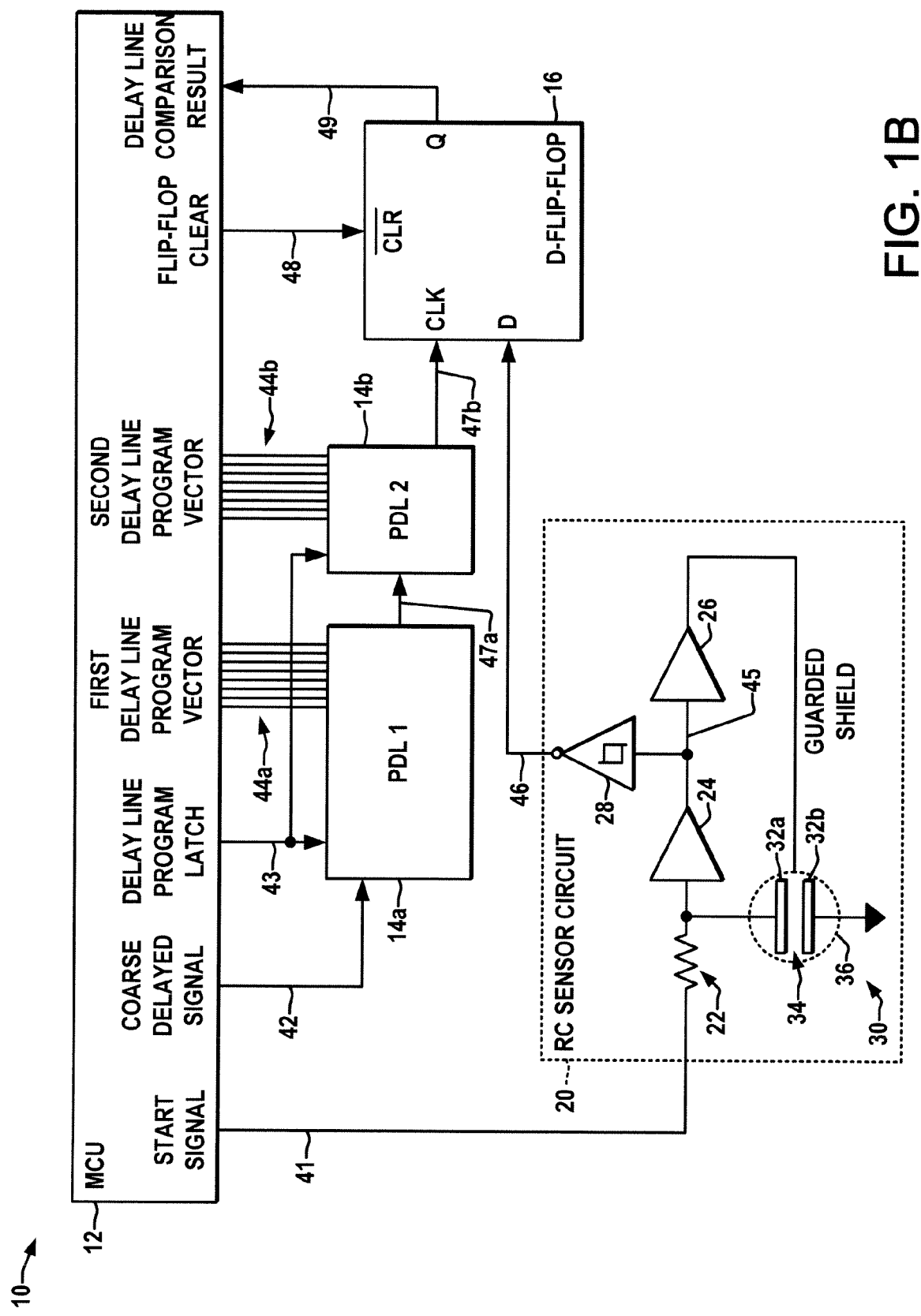
FIG. 1B is a schematic diagram illustrating another exemplary system for measuring capacitance changes of a sensed capacitor including two programmable delays in accordance with other aspects of the invention.

FIG. 1B illustrates an alternate capacitance measurement system 10 that includes two cascaded programmable delays 14a and 14b. As in the system of FIG. 1A, the sensor circuit 20 provides an RC charging network including the sensed capacitor 30 and a known resistance 22 such that the sensed capacitor 30 is charged through the resistance 22 upon a step change in the start signal 41 from the MCU 12, where the threshold detector 28 provides a transition in the output signal 46 that occurs a certain capacitance-dependent time after actuation of the start signal 41. The MCU 12 provides the coarse delayed signal 42 to enable or start the first PDL 14a, and also provides a first binary delay line program vector value 44a to the first PDL 14a that is latched according to the signal 43. The system 10 further includes a second PDL 14b receiving a start signal from the output 47a of the first PDL 14a, where the MCU 12 in this embodiment also provides a second delay line program vector value 44b which is latched by the second PDL 14b according to the latch signal 43. In one implementation of the system of FIG. 1B, the PDLs are binary weighted such that the least significant bit (LSB) of the first PDL 14a represents a digital delay value two times that of the most significant bit (MSB) of the second PDL 14b, although not strict requirement of the broad aspects of the invention.

As in the above described system of FIG. 1A, the first PDL 14a in FIG. 1B provides an output signal 47a that transitions from low to high the first programmed delay time 44a after the enable signal 42, which in turn causes the activation of the second PDL 14b. The second PDL 14b provides a high-going transition in its output 47b a second programmable delay time 44b later, which signal 47b provides the clock input CLK to the flip-flop 16. The data (D) input to the flip-flop 16 is provided by the output 46 of the threshold detector 28, whereby the Q output of the flip-flop 16 provides the signal 49 having a state indicative of whether the transition in the cascaded PDL output signal 47b occurs before or after the transition of the threshold detector output signal 46. In this embodiment, therefore, the coarse digital delay is again set by the delayed signal 42 and the fine adjustment delay is set by the delay line program vectors 44a and 44b from the MCU 12.

Figure 2:
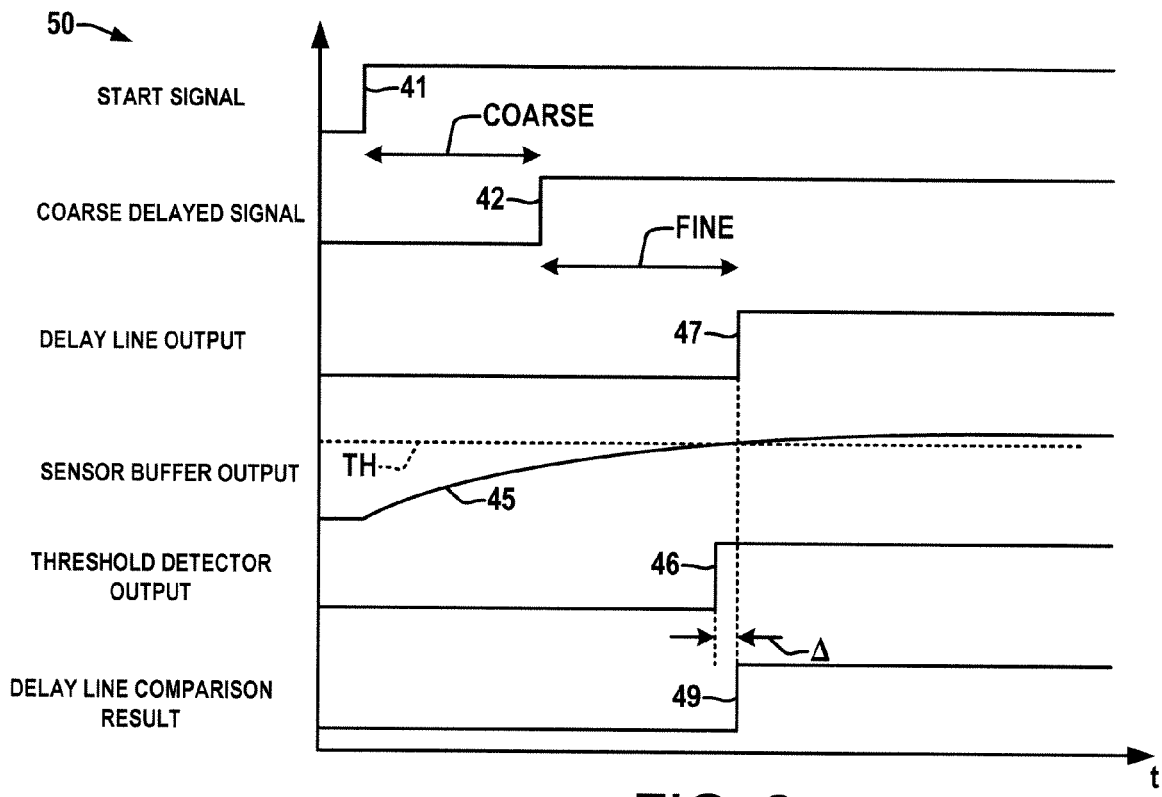
FIG. 2 is a diagram illustrating various signals in the system of FIG. 1 for a measurement cycle in which the digitally controlled programmable delay value is longer than the rise time of the RC sensing circuit.
Figure 3:
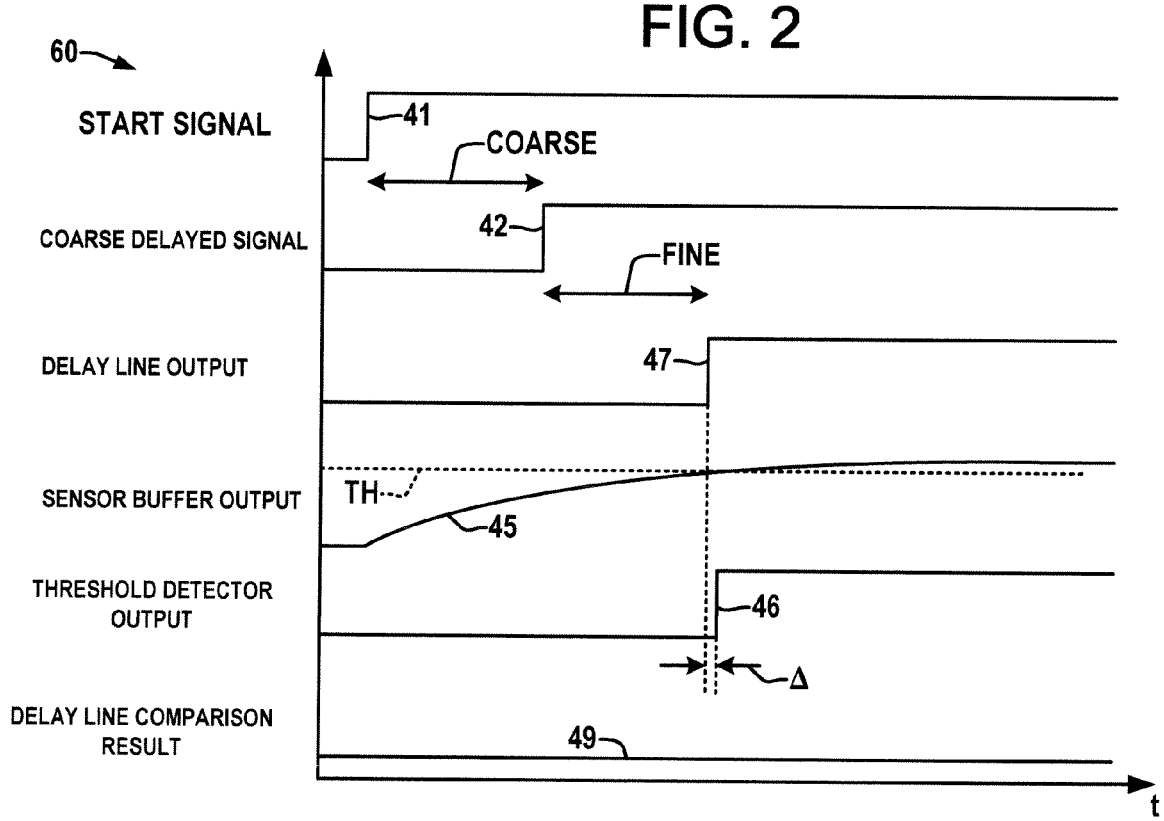
FIG. 3 is a diagram illustrating various signals in the system of FIG. 1 for another measurement cycle in which the digitally controlled programmable delay value is slightly shorter than the rise time of the RC sensing circuit.

FIGS. 2 and 3 illustrate diagrams 50 and 60, respectively, showing exemplary signals during measurement operation of the systems of FIGS. 1A and 1B, where the diagram 50 in FIG. 2 shows a measurement cycle in which the digitally controlled programmable delay value 44 (including the digitally controlled coarse delay time of the PDL enable signal 42) is longer than the rise time of the RC sensing circuit 20, for which the flip-flop output (when clocked by the programmable delay output 47) will be a binary "1", and the diagram 60 in FIG. 3 depicts another exemplary measurement cycle in which the digitally controlled programmable delay value 44 (plus the coarse delay 42) is slightly shorter than the rise time of the RC sensing circuit 20 for which the flip-flop output will be a binary "0".

In the embodiments of FIGS. 1A-3, the system 10 operates to compare the propagation delay generated by the sensor capacitor-based RC network 20 to a time delay produced under digital control by the MCU 12. The digitally generated delay of signal 47 (signal 47b in FIG. 1B), moreover, is adjusted by successive approximation under control of the MCU 12 until it reaches a best match to the sensor-generated delay 46. A binary number representing the measured delay (e.g., according to the number of clock cycles N used in generating the coarse delayed signal 42 plus the fine delay determined by the sum of the delays of the PDLs 14 set by the vectors 44) is reported as a measure of the sensed capacitor 30. Overall functionality of the system 10 is controlled by digital circuitry of the MCU 12 that initiates each measurement cycle by delivering an input voltage step transition (start signal) 41 to the sensor RC network 20. In response, the sensor circuitry 20 produces a transition signal 46 from the threshold detector 28 which is delayed by an amount determined by the value of the sensed capacitor 30 and the known value of the resistor 22. A digitally delayed evaluation transition signal 47 (or 47b in FIG. 1B), moreover, may be indexed from the start signal transition 41 by a predetermined number of clock cycles through delayed generation of the PDL enable signal 42 to provide a coarse delay that can be subsequently refined by the programmable delay line 14. In one embodiment, the number of clock cycles "N" used to generate the coarse delayed signal 42 for enabling or starting the PDL 14 is binary weighted to be twice the range of the PDL 14, and where embodiments involving two or more PDLs 14 (e.g., as in FIG. 1B) are employed, the PDLs 14 are cascaded in series with the output of one PDL (e.g., PDL 14a in FIG. 1B) driving the enable of the next programmable delay (e.g. PDL 14b in FIG. 1B), where the cascaded PDLs 14 may have ranges that are binary weighted.

The output transition 47 of the final delay line 14 (e.g., PDL 14b in FIG. 1B) is used to test if the sensor circuit's delayed transition has yet occurred. At the end of a measurement cycle, the MCU 12 determines whether to increase or decrease the programmable coarse and/or fine delays and by how much, based on whether the flip-flop output signal 49 is a binary "0" or a "1". In the example of FIG. 1A for instance, if the sensor circuit output transition in signal 46 happens after the programmable transition in signal 47, the digital delay 14 is adjusted longer, and otherwise the delay is made shorter. After each measurement cycle, the magnitude of delay change (increase or decrease amount) is halved in one embodiment. Once the delay has been adjusted by the finest resolution allowable by the PDL 14 (or by the last PDL 14b in FIG. 1B), the final delay measurement is presented in binary form by the digital circuitry of the MCU 12, and is interpreted as, or is used to derive, the measured value of the sensed capacitor 30.

The digitally generated delay consists of a voltage transition which occurs at a controlled amount of time after the start signal transition 41. The digitally generated delay in certain embodiments, moreover, can be synthesized in two steps. First, a coarse delay amount is produced via signal 42 by withholding (with respect to the start signal 41 applied to the sense capacitor circuit 20) the evaluation transition by a computed number "N" of digital clock cycles of the MCU 12. This delayed transition is then cascaded to a fine delay generator consisting of one or more PDLs 14. This allows delay resolution well beyond that of the digital clock rate, and the coarse adjustment 42 may be adjusted to provide a wide dynamic range while the overall resolution of the system 10 is set by the resolution of the PDL(s) 14.

Figure 4:
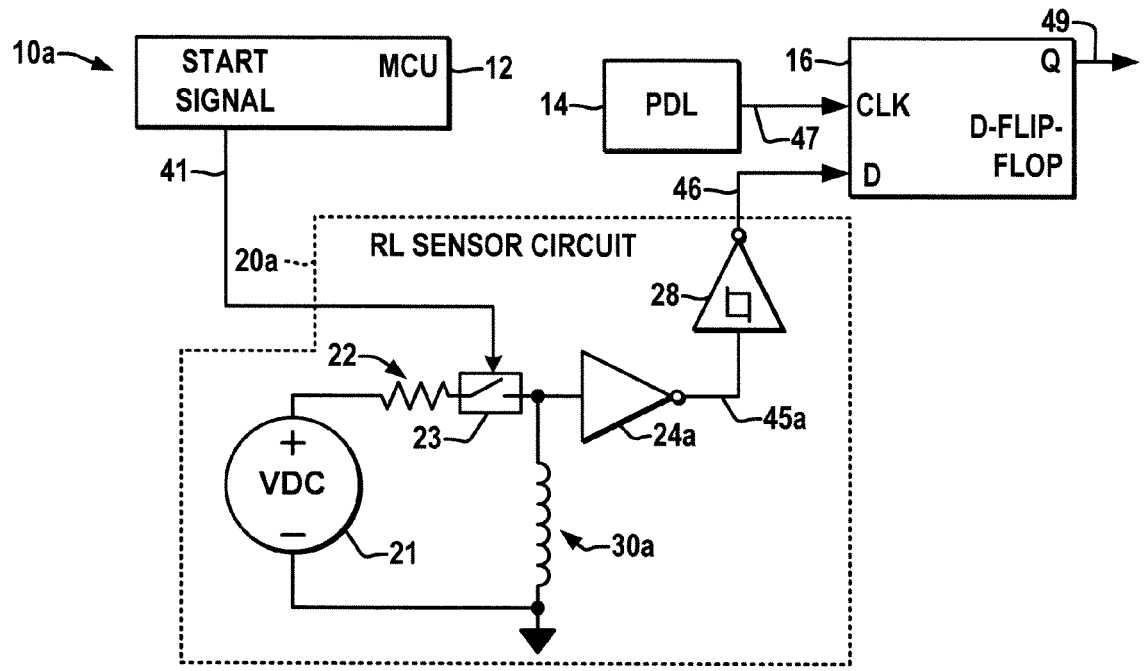
FIG. 4 is a schematic diagram illustrating another exemplary system for measuring reactance, in which an RL sensor circuit is provided for measurement of a sensed inductance in accordance with other aspects of the invention.
Figure 5:
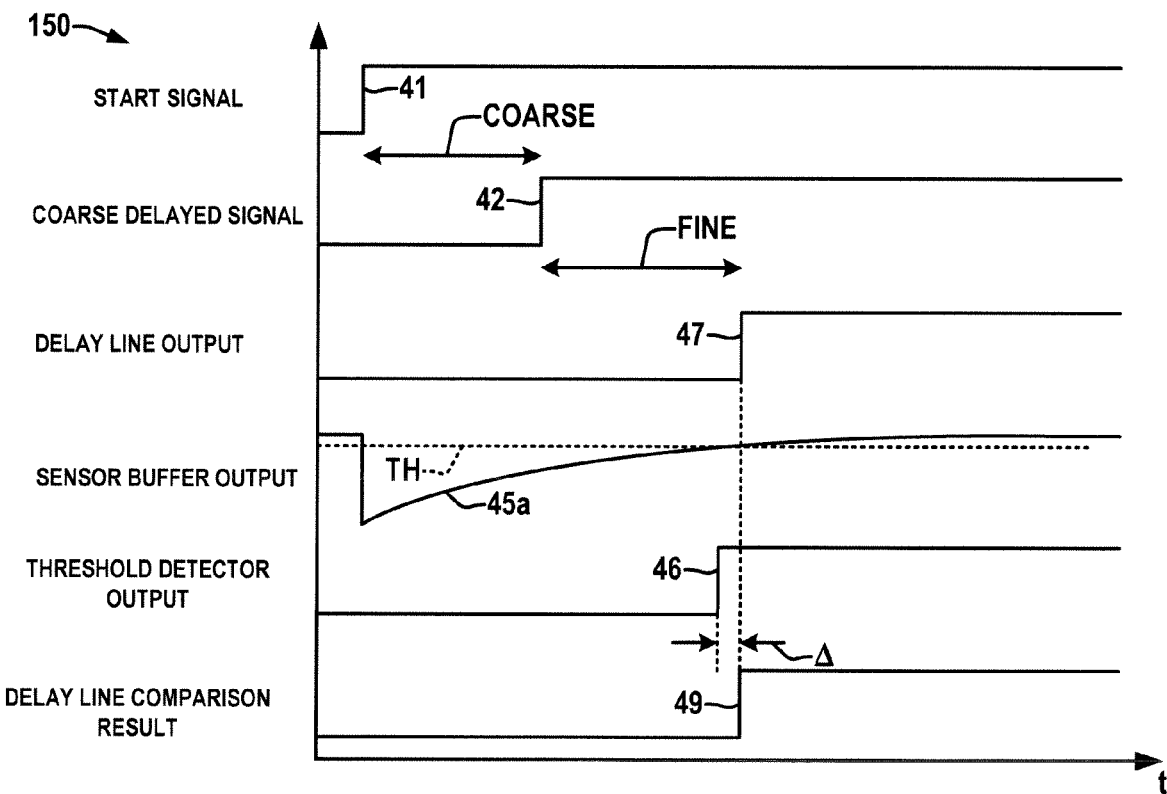
FIG. 5 is a diagram illustrating various signals in the system of FIG. 4 for a measurement cycle in which the digitally controlled programmable delay value is longer than the rise time of the RL sensing circuit for measuring a sensed inductance.

The exemplary RC sensor circuit or network 20 in FIGS. 1A and 1B provides a sensed capacitor-based delay generator including an RC network followed by a voltage threshold detector 28. An alternate embodiment is shown in FIGS. 4 and 5 in which an RL sensor circuit 20a is provided for measuring a sensed inductance. The voltage threshold detector 28 in the embodiments of FIGS. 1A and 1B examines the voltage across the sensed capacitor 30. A low-to-high transition is applied to the RC network at a time when the capacitor 30 is initially fully discharged, wherein the start signal 41 initiates charging of the sensed capacitor 30 through the series resistor 22. After the charge-up time associated with the RC time constant, the voltage across the sensed capacitor 30 (and hence the output of the low-capacitance buffer amplifier 24) reaches the turn-on threshold of the threshold detector 28. The threshold detector 28, in turn, presents a low-to-high output transition in the signal 46 in response to this threshold transition. The time difference between the input transition of the start signal 41 and the output transition of the threshold detector output signal 46 is thus the sensor-generated delay which corresponds to the sensed capacitance being measured.

The sensor capacitor voltage is monitored through a low-capacitance buffer amplifier 24 before being input to the threshold detector 28 in order to isolate the active sense capacitor plate 32a from noise, to reduce the amount of parasitic capacitance, and to provide a mechanism for driving the second buffer 26 for the guard shield network 36 without introducing further parasitic capacitance. Parasitic capacitance is thus advantageously minimized to allow for faster charge and discharge cycles and to reduce sensitivity to power supply variation. Aggressive guarded shielding provides the sensed capacitor active plate 32a with a buffered shield that tracks the capacitor plate potential 32a. This may advantageously reduce noise susceptibility, suppress fringing in the sensed capacitor's field, and reduce parasitic capacitance. The physical connection from the circuitry to the actual sense capacitor plate is also preferably guarded.

The sensor-generated delay from the start signal 41 to the threshold detector output transition 46 is measured by comparing it to the controlled, digitally generated delay including the coarse delay 42 and the programmable delay time(s) of the PDL(s) 14. The comparison is accomplished in the examples of FIGS. 1A and 1B by using the digitally generated delayed transition 47 (the output of the final PDL 14) as the instance of evaluation to test whether or not the sensor-generated delayed transition 46 has occurred. Evaluation is performed in one possible embodiment using a D-type flip-flop 16, although other embodiments are possible in which the relative timing of the transitions in signals 46 and 47 is ascertained. The final digital delay transition 47 in these implementations (47b in FIG. 1B) functions as the flip-flop clock input CLK, and the sensor circuit output 46 is read at the flip-flop 'D' input. The transition at the flip-flop clock input causes the flip-flop 16 to transfer the D input state to the Q output and hold that signal 49 in latched state for reading by the MCU 12. This latched flip-flop output signal 49 is then read by the digital circuitry 12 to determine if the sensor transition in signal 46 has occurred prior to the digitally programmable transition in signal 47. If not, the programmable digital delay (the coarse and/or fine delays) is adjusted longer, and otherwise the delay is made shorter. The outcome of each evaluation or iteration is recorded in binary form starting at the most significant bit (MSB) and working down to the least significant bit (LSB) of each measurement cycle, wherein the measurement adjustment may include adjustment of the PDL value(s) 44 and may also involve adjusting the number of clock cycles used to delay the enablement of the PDL 14 via the coarse adjustment signal 42. Once the LSB is recorded, the binary value corresponding to the sensed capacitance value is presented, after which a new sequence of measurement cycles may then be initiated.

The total number of measurement cycles required is related to the overall range of propagation delay expected and the finest delay resolution to be probed. The expected range of propagation delay is directly related to the expected range of capacitance to be measured. Rounding the range of measurable propagation delay up to a power of two times the PDL delay resolution (Tdmin) establishes the number of cycles as: Range of delay=$2^n$ times Tdmin, where n is the number of required cycles, and the result is a binary field with n bits. These cycles may be broken into two phases: a calibration phase, and a measurement phase. Since only small capacitance changes are anticipated for typical measurement applications, only the lower significant bits of delay range need to be exercised during measurement in certain embodiments. In this case, the upper bits need only be exercised during a calibration phase in order to determine the gross overall sensed capacitance. This calibration result may be retained and further resolved for each actual measurement. The rate of measurement may be increased by only repeating a reduced (less then n) number of cycles to attain a capacitance measurement.

One possible form of operation of the system 10 involves locating a digital delayed transition as close to an RC propagation delayed transition as possible. This results in very small time differences between these transitions as a solution is approached. Since a flip-flop 16 is used to perform the actual delay comparison, this flip-flop 16 is presented with violations of set-up or hold time requirements as the solution is approached. To ensure consistent flip-flop behavior with setup or hold violations, the flip flop is preferably reset via the reset (CLR') signal 48 from the MCU 12 before each evaluation. This bypasses the flip-flop's propensity to bias its next output based on its current state when a set-up or hold time minimum is violated. In this process, any next-state bias is fixed and stays consistent for each measurement.

The exemplary system 10 achieves enhanced resolution through use of a digitally programmable delay line 14 to produce a fine time delay for time delay measurement. This allows for a measurement resolution down to the step-size of the programmable delay line 14, rather than that of the digital clock of the MCU 12. This fine delay is ultimately used to measure the sensor capacitor-induced delay. The capacitor-induced delay reflects the value of the capacitance 30 and may be carried out with the fine precision established by the delay line 14. The dynamic range of the system 10, moreover, is extended through use of the high resolution delay line 14 in combination with the coarse adjustment 42 and/or by cascading more than one PDL 14, for instance, as shown in FIG. 1B, wherein any number of such cascaded PDLs 14 may be employed to achieve any desired resolution. Dynamic range for the exemplary system 10 of FIGS. 1A and 1B may be characterized as a ratio of the largest capacitance measurable to the smallest capacitance discernable, where the smallest discernable capacitance is established by the minimum step-size (resolution) of the last programmable delay line 14. The maximum measurable capacitance may be arbitrarily set by adding coarse digital delay to the measurement routine via the signal 42 under control of the MCU logic 12, and by adding successive approximation cycles. One practical limit is determined by the required measurement speed (maximum number of cycles allowed) and the expected value of the largest capacitance 30 to be measured.

Referring also to FIGS. 4 and 5, FIG. 4 illustrates an alternate sensor circuit 20a that can be employed in a measurement system 10a similar in other respects to the system 10 of FIGS. 1A and 1B above, wherein the sensor circuit 20a includes an RL network for measuring a sensed inductance 30a in accordance with other aspects of the invention. FIG. 5 depicts a timing diagram 150 showing various exemplary signals during operation of the system 10a of FIG. 4 for a typical measurement cycle in which the digitally controlled programmable delay value is longer than the rise time of the RL sensing circuit 20a. The RL sensor circuit 20a includes a DC voltage source 21, a known resistance 22, and a switch 23 controlled by the start signal 41 from the MCU 12 to selectively close when the start signal 41 transitions from low to high. The switch is connected between the resistance 22 and a circuit node tied to an upper end of the sensed inductance 30 and to the input of an inverting buffer amplifier 24a. The inverting amplifier 24a provides an output 45a that drives the input of the threshold detector amplifier 28, which in turn provides the sensed delay signal 46 to the data (D) input of the flip-flop 16. Closure of the switch 23 via the start signal 41 causes the voltage across the sensed inductance 30a to rise to the value of the DC source 21 and then decay at a rate determined by the RL time constant, whereby the inverted output of the buffer amplifier 24a initially drops to zero and then rises as shown in FIG. 5. The threshold detector 28, presents a low-to-high output transition in the signal 46 as the output 45a of the buffer 24a exceeds the threshold of the detector 28, where the temporal difference between the transition of the start signal 41 and the output transition 46 of the threshold detector 28 is the sensor-generated delay which corresponds to the sensed inductance 30a being measured.

As in the above capacitance measurement systems of FIGS. 1A and 1B, the flip-flop output signal 49 provides a Boolean output state representative of whether the programmable digital delay is greater than or less than the sensor generated delay (i.e., whether the transition in the PDL output 47 and hence the flip-flop clock input CLK occurs after or before the transition in the threshold detector output signal 46), wherein the Example of FIG. 5 illustrates the former case. The flip-flop output signal 49 is read by the MCU 12 to determine if the sensor transition in signal 46 has occurred prior to the digitally programmable transition in signal 47. If not, the vector(s) provided to the PDL(s) 14 is increased to provide a longer programmable delay, and otherwise the delay is made shorter for the next measurement successive approximation iteration, and the measurement process operates as generally described above in connection with the capacitance sensing examples.

The above implementations are merely illustrative of several possible embodiments of various aspects of the present invention, wherein equivalent alterations and/or modifications will occur to others skilled in the art upon reading and understanding this specification and the annexed drawings. In particular regard to the various functions performed by the above described components (assemblies, devices, systems, circuits, and the like), the terms (including a reference to a "means") used to describe such components are intended to correspond, unless otherwise indicated, to any component, such as hardware, software, or combinations thereof, which performs the specified function of the described component (i.e., that is functionally equivalent), even though not structurally equivalent to the disclosed structure which performs the function in the illustrated implementations of the invention. In addition, although a particular feature of the invention may have been disclosed with respect to only one of several implementations, such feature may be combined with one or more other features of the other implementations as may be desired and advantageous for any given or particular application. Also, to the extent that the terms "including", "includes", "having", "has", "with", or variants thereof are used in the detailed description and/or in the claims, such terms are intended to be inclusive in a manner similar to the term "comprising".

Having thus described the invention, the following is claimed:

1. A system for high resolution sensing of reactance or changes in reactance in a large dynamic range, comprising:
   a digital circuit providing a digitally controlled delay value, and a sensor circuit start signal;
   a programmable delay line providing a digital transition output at a time following the start signal according to the digitally controlled delay value;
   a sensor circuit including a known resistor and a sensed reactance forming an RC or RL circuit that receives the start signal and provides a sensor transition output at a sensor delay time following the start signal determined by the sensed reactance and the known resistor; and a comparison circuit to determine whether the sensor transition output occurs before or after the digital transition output.

2. The system of claim 1, wherein the sensed reactance is a sensed capacitance forming an RC circuit with the known resistance.

3. The system of claim 2, comprising a plurality of programmable delay lines of differing resolutions cascaded to provide the digital transition output at a time following the start signal according to the digitally controlled delay value.

4. The system of claim 3, wherein the plurality of programmable delay lines are of binary weighted resolutions.

5. The system of claim 3, wherein the digital circuit provides a delay signal to activate a first one of the plurality of programmable delay lines a coarse delay time after the start signal.

6. The system of claim 5, wherein the digital circuit comprises a clock with an associated clock cycle, and wherein the digital circuit provides the delay signal an integer number of clock cycles after the start signal.

7. The system of claim 2, wherein the digital circuit provides a delay signal to activate the programmable delay line a coarse delay time after the start signal.

8. The system of claim 7, wherein the digital circuit comprises a clock with an associated clock cycle, and wherein the digital circuit provides the delay signal an integer number of clock cycles after the start signal.

9. The system of claim 1, comprising a plurality of programmable delay lines of differing resolutions cascaded to provide the digital transition output at a time following the start signal according to the digitally controlled delay value.

10. The system of claim 9, wherein the plurality of programmable delay lines are of binary weighted resolutions.

11. The system of claim 9, wherein the digital circuit provides a delay signal to activate a first one of the plurality of programmable delay lines a coarse delay time after the start signal.

12. The system of claim 1, wherein the sensed reactance is a sensed inductance forming an RL circuit with the known resistance.

13. The system of claim 12, comprising a plurality of programmable delay lines of differing resolutions cascaded to provide the digital transition output at a time following the start signal according to the digitally controlled delay value.

14. The system of claim 13, wherein the plurality of programmable delay lines are of binary weighted resolutions.

15. The system of claim 13, wherein the digital circuit provides a delay signal to activate a first one of the plurality of programmable delay lines a coarse delay time after the start signal.

16. The system of claim 12, wherein the digital circuit provides a delay signal to activate the programmable delay line a coarse delay time after the start signal.

17. The system of claim 16, wherein the digital circuit comprises a clock with an associated clock cycle, and wherein the digital circuit provides the delay signal an integer number of clock cycles after the start signal.

18. A method of sensing of reactance or changes in reactance in a large dynamic range, comprising:
    (a) connecting a sensed reactance with a known resistance in a sensor circuit;
    (b) providing a delay value to a programmable delay line;
    (c) providing a start signal to the sensor circuit;
    (d) activating the programmable delay line;
    (e) performing a comparison of a sensor circuit output signal and a programmable delay line output signal;
    (f) selectively providing an adjusted delay value to the programmable delay line based on the comparison of the sensor circuit and programmable delay line output signals;
    (g) repeating steps (c)-(f) until a delay value is determined for which the sensor circuit and programmable delay line output signals are within an acceptable resolution value of one another; and
    (h) using the last delay value to represent the sensed reactance or change in reactance.

19. The method of claim 18, wherein the programmable delay line is activated a coarse adjustment time after the start signal is provided to the sensor circuit.

20. The method of claim 19, further comprising selectively adjusting the coarse adjustment time to accommodate reactance measurements over a wide dynamic range.

* * * * *